United States Patent
Makino

(10) Patent No.: US 8,325,532 B2
(45) Date of Patent: Dec. 4, 2012

(54) SEMICONDUCTOR INTEGRATED CIRCUIT DEVICE

(75) Inventor: Eiichi Makino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 12/754,149

(22) Filed: Apr. 5, 2010

(65) Prior Publication Data

US 2010/0271881 A1     Oct. 28, 2010

(30) Foreign Application Priority Data

Apr. 24, 2009   (JP) ................. 2009-106673

(51) Int. Cl.
  *G11C 16/02*    (2006.01)
  *G11C 5/14*    (2006.01)
  *G11C 8/00*    (2006.01)
  *G11C 11/00*    (2006.01)

(52) U.S. Cl. .............. 365/185.18; 365/226; 365/230.03; 365/148

(58) Field of Classification Search .............. 365/185.18, 365/226, 230.03, 148
See application file for complete search history.

(56) References Cited

U.S. PATENT DOCUMENTS

| | | | | |
|---|---|---|---|---|
| 7,590,023 B2* | 9/2009 | Kim | ................. | 365/226 |
| 7,619,945 B2* | 11/2009 | Norman | ................. | 365/226 |
| 7,952,942 B1* | 5/2011 | Kutz et al. | ................. | 365/189.12 |
| 2002/0031038 A1* | 3/2002 | Honda et al. | ................. | 365/230.03 |
| 2009/0295774 A1* | 12/2009 | Okamoto | ................. | 345/211 |

FOREIGN PATENT DOCUMENTS

| | | |
|---|---|---|
| JP | 6-190587 | 7/1994 |
| KR | 10-0824192 | 4/2008 |
| KR | 10-2008-0044401 | 5/2008 |

OTHER PUBLICATIONS

Office Action issued Nov. 15, 2011, in Korean Patent Application No. 10-2010-24049 with English translation.

* cited by examiner

*Primary Examiner* — Alexander Sofocleous
*Assistant Examiner* — Hai Pham
(74) *Attorney, Agent, or Firm* — Oblon, Spivak, McClelland, Maier & Neustadt, L.L.P.

(57) ABSTRACT

A semiconductor integrated circuit device includes a memory cell array including a plurality of planes each including a plurality of memory cells, a power supply voltage generating circuit including a voltage generating circuit configured to generate a power supply voltage common to the plurality of planes, a select number detection circuit configured to detect a number of selected planes of the plurality of planes, and a resistance variable circuit configured to vary a wiring resistance between the plurality of planes and the voltage generating circuit in accordance with the number of selected planes, which is reported from the select number detection circuit, and a control circuit configured to control the power supply voltage generating circuit.

24 Claims, 11 Drawing Sheets

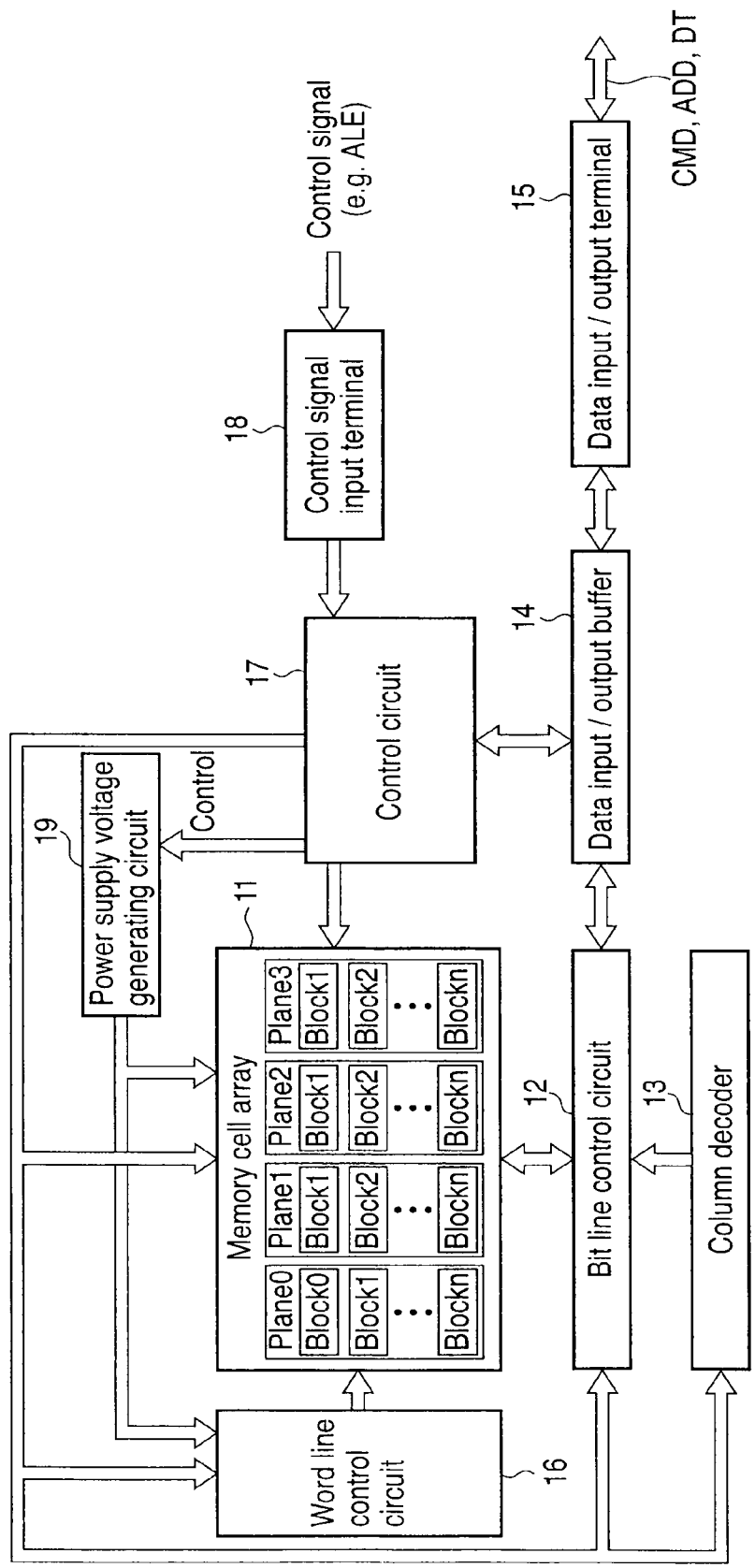
F I G. 1

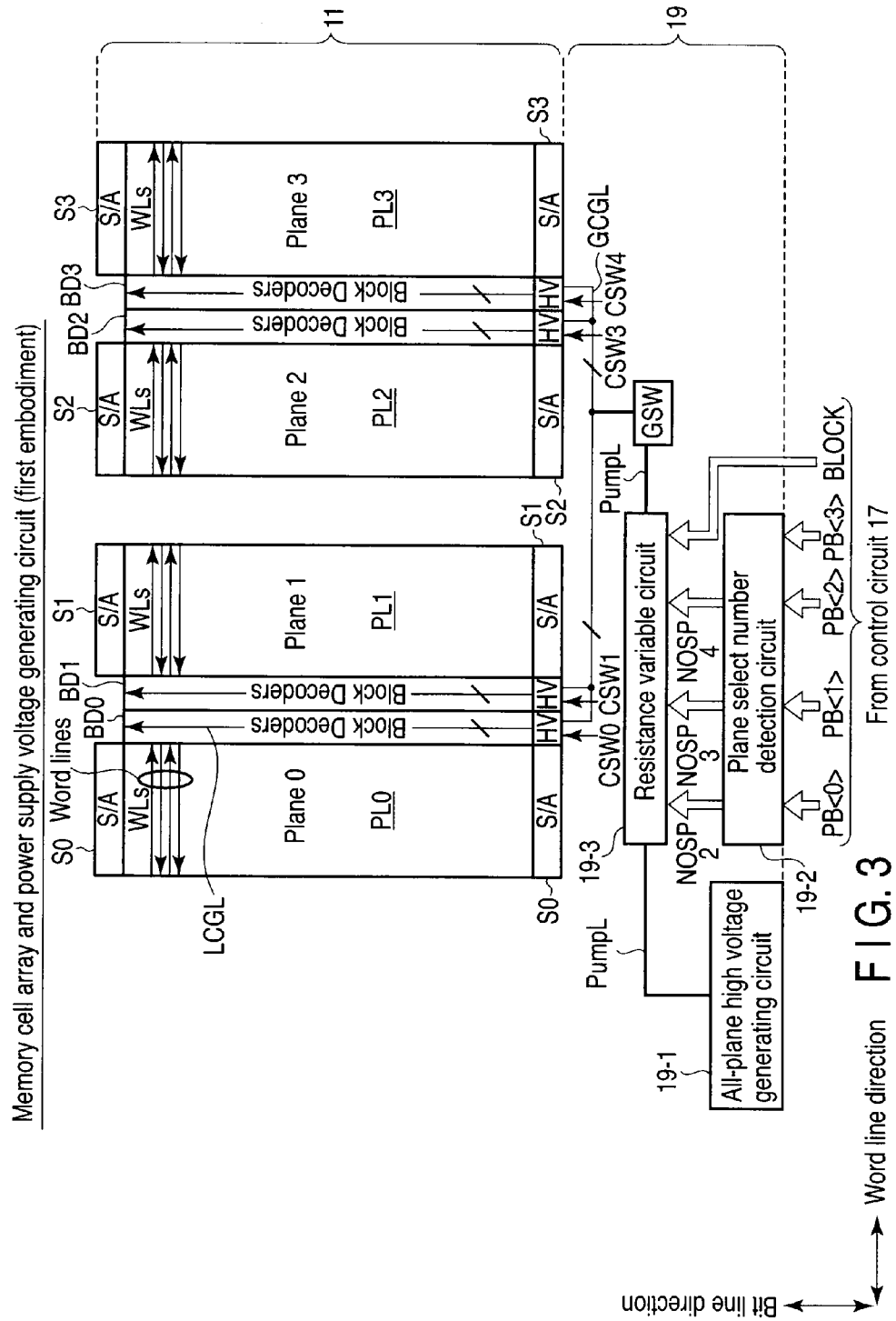
F I G. 3

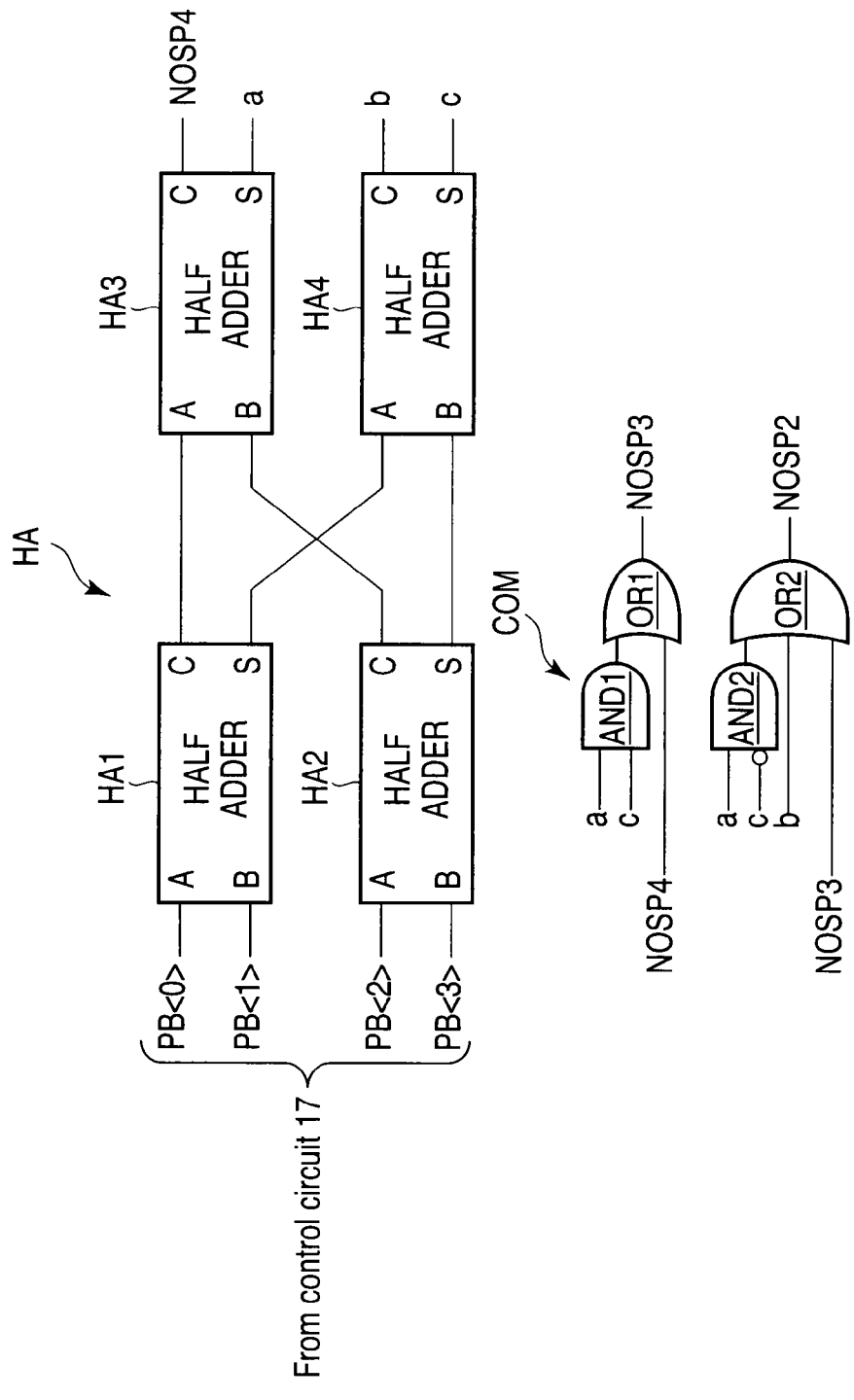
F I G. 4

Operation table of resistance variable circuit

|  | 1 plane | 2 plane | 3 plane | 4 plane | BLOCK |
|---|---|---|---|---|---|
| SW1 | OFF | OFF | OFF | OFF | ON |
| SW2 | OFF | ON | ON | ON | ON |
| SW3 | OFF | OFF | ON | ON | ON |
| SW4 | OFF | OFF | OFF | ON | ON |
| Composite resistance R | R1 | $\dfrac{1}{1/R1+1/R2}$ | $\dfrac{1}{1/R1+1/R2+1/R3}$ | $\dfrac{1}{1/R1+1/R2+1/R3+1/R4}$ | Bypass |

FIG. 6

Composite resistance

|  | 1 plane | 2 plane | 3 plane | 4 plane | BLOCK |
|---|---|---|---|---|---|
| Composite resistance R | 30K | 18.8K | 13.6K | 10.7K | Bypass |
| ratio | 1.0 | 1/1.6 | 1/2.2 | 1/2.8 | Bypass |

(R1 = about 30 k$\Omega$, R2 = R3 = R4 = about 50 k$\Omega$)

FIG. 7

Total of wiring load capacitance

| Common part | Depending on number of selected planes (×4) |
|---|---|
| C1(Global CG) | C2(Local CG)+C3(WL) |

FIG. 9

Relationship between number of selected planes and load capacitance

| Selected plane(s) | Capacitance per 1WL / plane | Ratio |
|---|---|---|
| 1 plane | 5 + (2+6)*1 = 13pF | 1.0 |
| 2 plane | 5 + (2+6)*2 = 21pF | 1.6 |
| 3 plane | 5 + (2+6)*3 = 29pF | 2.2 |
| 4 plane | 5 + (2+6)*4 = 37pF | 2.8 |

Common capacitance (C1)

Capacitance depending on selected plane (C2+C3)

Compared to 1-plane time, capacitance is not simply doubled at 2-plane time since there is load of common part (not depending on number of planes)

FIG. 10

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2009-106673, filed Apr. 24, 2009, the entire contents of which are incorporated herein by reference.

BACKGROUND OF THE INVENTION

1. Field of the Invention

The present invention relates to a semiconductor integrated circuit device, which is applicable to, for example, a NAND flash memory.

2. Description of the Related Art

In recent years, by virtue of such advantages as large capacity and nonvolatility, NAND flash memories, for example, have been mounted in various electronic apparatuses including portable audio devices.

Under the circumstances, main challenging problems of the NAND flash memory, which are to be addressed hereafter, are an improvement of its functions and a further increase in memory capacity. In order to realize the increase in capacity, it is thought to be a prospective solution to construct a memory cell array in a multi-plane configuration, thereby to suppress degradation in characteristics due to an increase in word line length and bit line length, while promoting microfabrication of memory cells (Jpn. Pat. Appln. KOKAI Publication No. H6-190587).

BRIEF SUMMARY OF THE INVENTION

According to an aspect of the present invention, there is provided a semiconductor integrated circuit device comprising: a memory cell array including a plurality of planes each including a plurality of memory cells; a power supply voltage generating circuit including a voltage generating circuit configured to generate a power supply voltage common to the plurality of planes, a select number detection circuit configured to detect a number of selected planes of the plurality of planes, and a resistance variable circuit configured to vary a wiring resistance between the plurality of planes and the voltage generating circuit in accordance with the number of selected planes, which is reported from the select number detection circuit; and a control circuit configured to control the power supply voltage generating circuit.

According to another aspect of the present invention, there is provided a semiconductor integrated circuit device comprising: a memory cell array including two planes each including a plurality of memory cells; a power supply voltage generating circuit including a voltage generating circuit configured to generate a power supply voltage common to the two planes, and a resistance variable circuit configured to vary a wiring resistance between the two planes and the voltage generating circuit in accordance with a number of selected planes of the two planes; and a control circuit configured to control the power supply voltage generating circuit.

According to still another aspect of the present invention, there is provided a semiconductor integrated circuit device comprising: a memory cell array including two planes each including a plurality of memory cells; a power supply voltage generating circuit including a voltage generating circuit configured to generate a power supply voltage common to the two planes, and a resistance variable circuit configured to vary a wiring resistance between the two planes and the voltage generating circuit; and a control circuit configured to control the power supply voltage generating circuit.

BRIEF DESCRIPTION OF THE SEVERAL VIEWS OF THE DRAWING

FIG. 1 is a block diagram showing an entire structure example of a semiconductor integrated circuit device according to a first embodiment of the present invention;

FIG. 3 is a block diagram showing a memory cell array and a power supply voltage generating circuit according to the first embodiment;

FIG. 4 is an equivalent circuit diagram showing a plane select number detection circuit according to the first embodiment;

FIG. 6 shows the operation of the resistance variable circuit according to the first embodiment;

FIG. 7 is an equivalent circuit diagram showing a composite resistance of the semiconductor integrated circuit device according to the first embodiment;

FIG. 9 shows a wiring load capacitance according to the first embodiment;

FIG. 10 shows the relationship between the number of selected planes and a wiring load capacitance in the first embodiment;

DETAILED DESCRIPTION OF THE INVENTION

Figure 2:
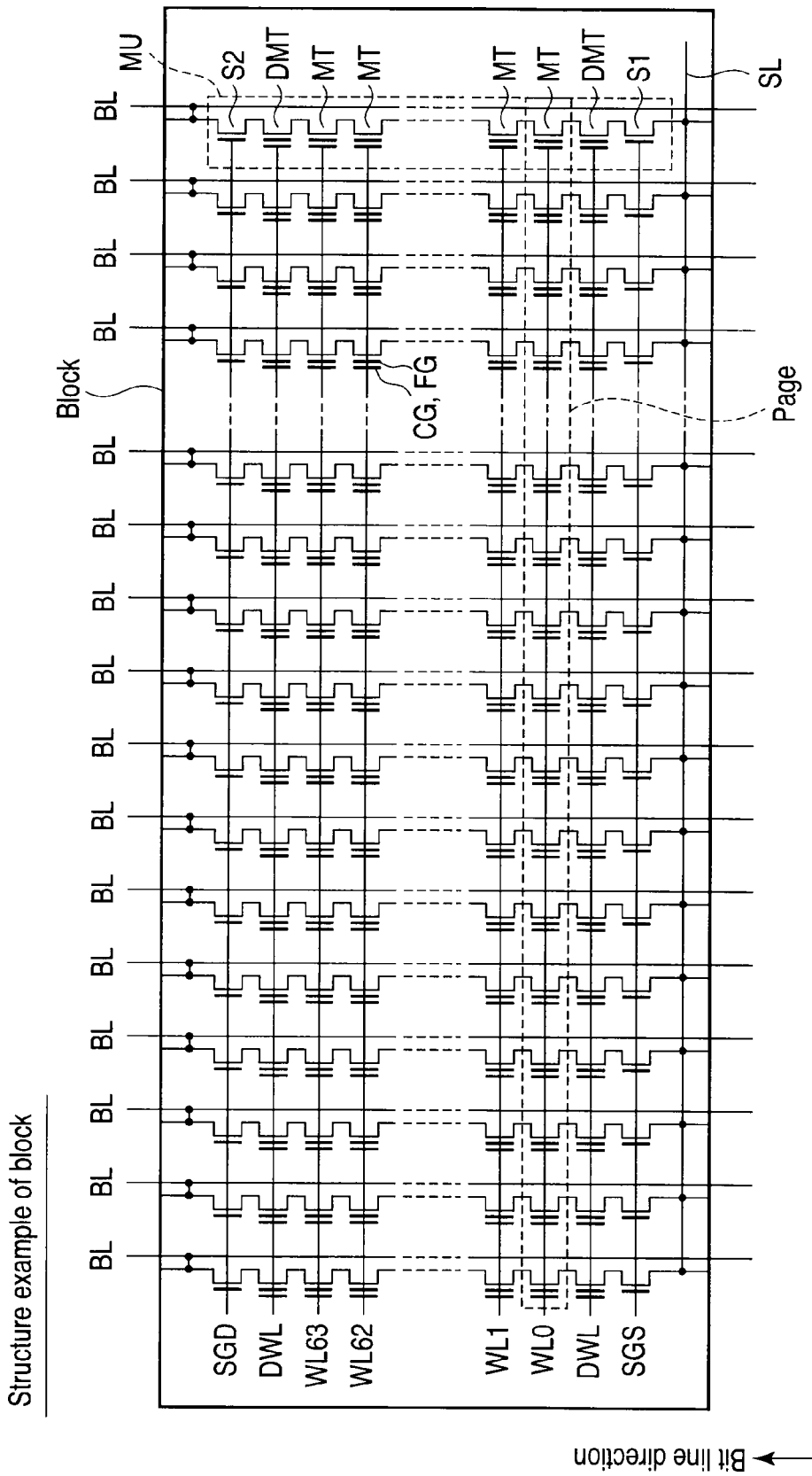
FIG. 2 is an equivalent circuit diagram showing a structure example of a block in FIG. 1.

If a multi-plane implementation of two planes or more is promoted, a load capacitance varies in accordance with the variation of the number of selected planes, and consequently the charge time greatly varies depending on the number of selected planes. Thus, there is a tendency that the operation margin deteriorates.

Embodiments of the present invention will now be described with reference to the accompanying drawings. In the description below, common parts are denoted by like reference numerals throughout the drawings. Although a NAND flash memory is described below as an example of a semiconductor integrated circuit device, the invention is not limited to the NAND flash memory.

First Embodiment

Referring to FIG. 1 to FIG. 12, a semiconductor integrated circuit device according to a first embodiment of the invention is described.

<1. Structure Example>

1-1. Entire Structure Example

To begin with, referring to FIG. 1, an entire structure example of the semiconductor integrated circuit device according to the first embodiment of the invention is described.

As shown in FIG. 1, the semiconductor integrated circuit device according to the first embodiment comprises a memory cell array 11, a bit line control circuit 12, a column decoder 13, a data input/output buffer 14, a data input/output terminal 15, a word line control circuit 16, a control circuit 17, a control signal input terminal 18 and a power supply voltage generating circuit 19.

The memory cell array 11 includes a plurality of planes. In the case of the present embodiment, the memory cell array 11 has a multi-plane configuration comprising four planes (Plane 0, Plane 1, Plane 2 and Plane 3). Each of the planes comprises a plurality of blocks (Block 0 to Block n). The word line control circuit 16 which controls word lines, the bit line control circuit 12 which controls bit lines, the control circuit 17 and the power supply voltage generating circuit 19 are electrically connected to the memory cell array 11.

The bit line control circuit 12 reads out data of memory cells in the memory cell array 11 via the bit lines, and detects the states of memory cells in the memory cell array 11 via the bit lines. In addition, the bit line control circuit 12 applies a write control voltage to the memory cells in the memory cell array 11 via the bit lines, thereby executing data write in the memory cells. The column decoder 13, data input/output buffer 14 and control circuit 17 are electrically connected to the bit line control circuit 12.

A data memory circuit (not shown) is provided in the bit line control circuit 12, and the data memory circuit is selected by the column decoder 13. The data of the memory cell, which is read out to the data memory circuit, is output to the outside from the data input/output terminal via the data input/output buffer 14. The data input/output terminal 15 is connected to, for example, a host apparatus which is provided outside the NAND flash memory.

The host apparatus is, for example, a microcomputer, and receives data which is output from the data input/output terminal 15. Further, the host apparatus outputs various commands CMD, addresses ADD and data DT, which control the operation of the NAND flash memory. The write data DT, which is input from the host apparatus to the data input/output terminal 15, is supplied via the data input/output buffer 14 to the data memory circuit (not shown) which is selected by the column decoder 13. On the other hand, the command CMD and the address ADD are supplied to the control circuit 17.

The word line control circuit 16 selects a word line in the memory cell array 11, and applies to the selected word line a voltage necessary for read, write or erase, which is supplied from the power supply voltage generating circuit 19.

The control circuit 17 is electrically connected to the memory cell array 11, bit line control circuit 12, column decoder 13, data input/output buffer 14, word line control circuit 16 and power supply voltage generating circuit 19. These connected structural circuits are controlled by the control circuit 17. The control circuit 17 is connected to the control signal input terminal 18, and is controlled by a control signal, such as an ALE (address latch enable) signal, which is input from the external host apparatus via the control signal input terminal 18. In addition, the control circuit 17 outputs a control signal (to be described later) to the power supply voltage generating circuit 19, and controls the power supply voltage generating circuit 19.

The power supply voltage generating circuit 19 supplies necessary voltages to the memory cell array 11 and word line control circuit 16, in accordance with the control by the control circuit 17.

The word line control circuit 16, bit line control circuit 12, column decoder 13, control circuit 17 and power supply voltage generating circuit 19 constitute a write circuit, a read circuit and an erase circuit.

1-2. Structure Example of Block

Next, referring to FIG. 2, a structure example of the block is described. One block in FIG. 1 is described by way of example. In the case of this example, the memory cell transistors in the block are erased batchwise. In short, the block is a data erase unit.

The block (Block) comprises a plurality of memory cell units MU which are arranged in a WL (word line) direction. The memory cell unit MU comprises a NAND string, a select transistor S1 connected to one end of the NAND string, and a select transistor S2 connected to the other end of the NAND string. The NAND string comprises 64 memory cell transistors having current paths connected in series, and two dummy cell transistors DMT. In this example, memory cell transistors neighboring the source line SL and bit line BL are the dummy cell transistors DMT. Since these cell transistors are not made to function as memory cells, the defect ratio of the memory cell unit MU can effectively be reduced.

Each of the memory cell transistors MT and dummy cell transistors DMT has a multilayer structure comprising a gate insulation film, a charge accumulation layer FG, an inter-gate insulation film and a control electrode layer CG, which are successively provided on a semiconductor substrate.

In the present embodiment, the NAND string comprises 64 memory cell transistors MT. However, the number of memory cell transistors MT is not limited to 64, and may be two or more, for example, 8 or 16.

One end of the current path of the select transistor S1 is connected to the source line SL, and one end of the current path of the select transistor S2 is connected to the bit line BL.

The word line WL extends in the WL direction, and is connected commonly to the control electrodes of the plural memory cell transistors MT in the WL direction. A select gate line SGS extends in the WL direction, and is connected commonly to the plural select transistors S1 in the WL direction. Similarly, a select gate line SGD extends in the WL direction, and is connected commonly to the plural select transistors S2 in the WL direction.

1-3. Structure Example of the Memory Cell Array and the Power Supply Voltage Generating Circuit Next, referring to FIG. 3, a description is given of a structure example of the memory cell array 11 and the power supply voltage generating circuit 19. As shown in FIG. 3, in this example, the memory cell array 11 comprises four planes (Plane 0, Plane 1, Plane 2, Plane 3).

The plane PL0 comprises a plurality of blocks (depiction is omitted), sense amplifiers S0, a block decoder BD0 and a local switch LSW (HV).

Although a detailed description of the block is omitted, at least a plurality of word lines WLs are arranged along the word line direction, as shown in FIG. 3. The sense amplifiers S0 are disposed in a manner to sandwich the plural blocks in the bit line direction, and read out data from the memory cell transistors. The block decoder BD0 includes a local control line LCGL along the bit line direction and selects one of the plural blocks in accordance with a block select signal. The local switch LSW switches ON/OFF of the block decoder BD0 in accordance with a local control signal CSW0 which is input from the control circuit 17. The other planes PL1 to PL3 have substantially the same structure as the plane PL0, and a detailed description thereof is omitted.

The power supply voltage generating circuit 19 comprises an all-plane high voltage generating circuit 19-1, a plane select number detection circuit 19-2, a resistance variable circuit 19-3 and a global switch circuit GSW.

The all-plane high voltage generating circuit 19-1 is configured to generate a power supply voltage which is common to the four planes PL0 to PL3. In addition, the all-plane high voltage generating circuit 19-1 is set in an inactive state when the NAND flash memory chip is in a standby state. Thus, the power consumption can effectively be reduced.

The plane select number detection circuit 19-2 is configured to detect a select number of plural planes PL0 to PL3. To be more specific, the plane select number detection circuit 19-2 detects the number of selected planes of the plural planes PL0 to PL3, on the basis of control signals PB<0> to PB<3> which are input from the control circuit 17, and reports plane select signals NOSP2 to NOSP4 to the resistance variable circuit 19-3. The details will be described later.

The resistance variable circuit 19-3 is configured to vary the resistance of a wiring (pump section wiring PumpL) between the planes PL0 to PL3 and the all-plane high voltage generating circuit 19-1, in accordance with the plane select number (select signals NOSP2 to NOSP4), which are reported from the plane select number detection circuit 19-2, and a block select signal (BLOCK) which is reported from the control circuit 17. In other words, the resistance variable circuit 19-3 is disposed such that the resistance variable circuit 19-3 is inserted in the wiring (pump section wiring PumpL) between the word lines WLs and the all-plane high voltage generating circuit 19-1. The details will be described later.

The global switch circuit GSW switches and supplies the power supply voltage, which is supplied from the all-plane high voltage generating circuit 19-1 and varied by the resistance variable circuit 19-3, to the selected plane (PL0 to PL3). The global switch circuit GSW and the plural planes PL0 to PL3 are electrically connected by a global control gate line GCGL.

The all-plane high voltage generating circuit 19-1 and the global switch circuit GSW are electrically connected by the pump section wiring PumpL via the resistance variable circuit 19-3.

1-4. Structure Example of Plane Select Number Detection Circuit 19-2

Next, referring to FIG. 4, a description is given of a structure example of the plane select number detection circuit 19-2 according to the present embodiment.

As shown in FIG. 4, the plane select number detection circuit 19-2 according to the present embodiment comprises a half adder module HA which half-adds control signals (PB<0> to PB<3>) that are input from the control circuit 17, and a compound module COM which compounds signals from the half adder module HA and generates a plane select signal (NOSP2 to NOSP4).

The half adder module HA comprises half adder circuits HA1 to HA4.

The half adder circuit (HALF ADDER) HA1 has inputs (A) and (B) to which control signals PB<0> and PB<1> are input, has an output (C) connected to an input (A) of the half adder circuit HA3, and has an output (S) connected to an input (A) of the half adder circuit HA4.

The half adder circuit (HALF ADDER) HA2 has inputs (A) and (B) to which control signals PB<2> and PB<3> are input, has an output (C) connected to an input (B) of the half adder circuit HA3, and has an output (S) connected to an input (B) of the half adder circuit HA4.

The half adder circuit (HALF ADDER) HA3 has an output (C), from which a plane select signal NOSP4 is input to the compound circuit module COM, and has an output (S) connected to an input (a) of the composite circuit module COM.

The half adder circuit (HALF ADDER) HA4 has an output (C) connected to an input (b) of the compound circuit module COM, and has an output (S) connected to an input (c) of the composite circuit module COM.

The compound module COM comprises AND circuits AND1 and AND2, and OR circuits OR1 and OR2.

The AND circuit AND1 has inputs (a) and (c) connected to the outputs (a) and (c) of the half adder circuits HA3 and HA4, and has an output connected to an input of the OR circuit OR1.

The AND circuit AND2 has inputs (a) and (c) connected to the output (a) of the half adder circuit HA3 and an inverted output of the output (c) of the half adder circuit HA4, respectively, and has an output connected to an input of the OR circuit OR2.

The OR circuit OR1 has one input connected to the output of the AND circuit AND1, has the other input to which the plane select signal NOSP4 is output from the half adder circuit HA3, and has an output which outputs a plane select signal NOSP3.

The OR circuit OR2 has one input connected to the output of the AND circuit AND2, has another input connected to the output (b) of the half adder circuit HA4, and has the other input to which the plane select signal NOSP3 is output from the OR circuit OR1, and also has an output which outputs a plane select signal NOSP2.

1-5. Resistance Variable Circuit 19-3

Next, referring to FIG. 5 to FIG. 8, a description is given of the resistance variable circuit 19-3 according to the present embodiment.

1-5-1. Structure Example

Figure 5:
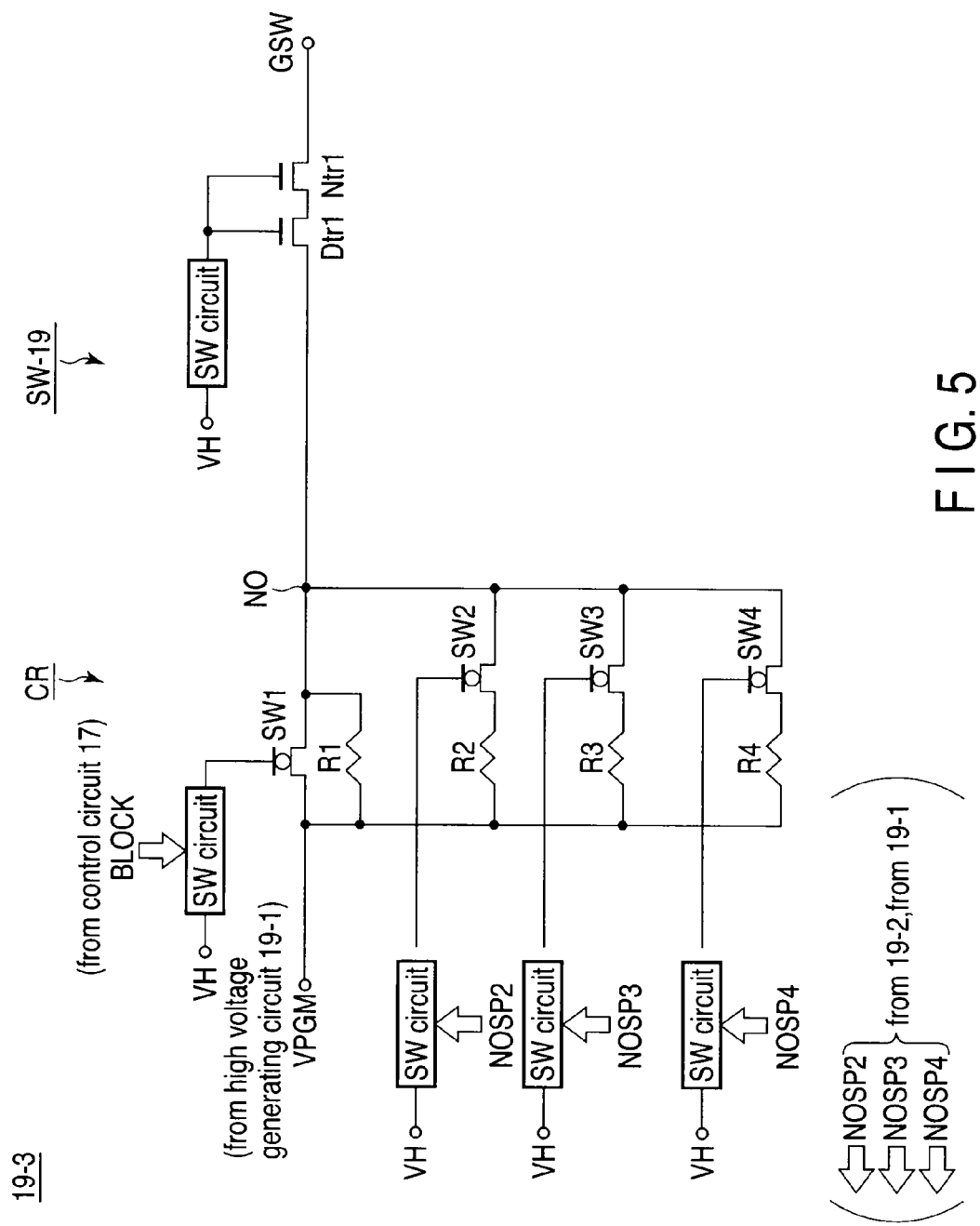
FIG. 5 is an equivalent circuit diagram showing a resistance variable circuit according to the first embodiment.

As shown in FIG. 5, the resistance variable circuit 19-3 according to the present embodiment comprises a composite resistance module CR which varies its own composite resistance in accordance with the select plane number (NOSP2 to NOSP4) and the block select signal BLOCK, and a switch module SW-19 which switches and connects the output of the composite resistance module CR to the memory cell array 11 (global switch circuit GSW).

The composite resistance module CR comprises SW circuits, resistor elements R1 to R4 and switching elements SW1 to SW4.

The switch module SW-19 comprises a SW circuit, a D-type transistor Dtr1 and an N-type transistor Ntr1.

The switch circuit has an input connected to a high voltage power supply HV which is input from the high voltage generating circuit 19-1, and outputs signals to the gates of the switching elements SW1 to SW4 and the gates of the transistors Dtr1 and Ntr1 in accordance with the plane control signals NOSP2 to NOSP4 from the select number detection circuit 19-2 or the block select signal BLOCK from the control circuit 17.

The resistor element R1 has one end connected to a program voltage VPGM, and the other end connected to one end of the current path of the switching element SW1.

The resistor element R2 has one end connected to the program voltage VPGM, and the other end connected to one end of the current path of the switching element SW2.

The resistor element R3 has one end connected to the program voltage VPGM, and the other end connected to one end of the current path of the switching element SW3.

The resistor element R4 has one end connected to the program voltage VPGM, and the other end connected to one end of the current path of the switching element SW4.

The above-mentioned one end of the current path of the switching element SW1 is connected to one end of the current path of the D-type transistor Dtr1, and the gate of the switching element SW1 is connected to the output of the SW circuit.

The other end of the current path of the switching element SW2 is connected to the one end of the current path of the D-type transistor Dtr1, and the gate of the switching element SW2 is connected to the output of the SW circuit.

The other end of the current path of the switching element SW3 is connected to the one end of the current path of the D-type transistor Dtr1, and the gate of the switching element SW3 is connected to the output of the SW circuit.

The other end of the current path of the switching element SW4 is connected to the one end of the current path of the D-type transistor Dtr1, and the gate of the switching element SW4 is connected to the output of the SW circuit.

The other end of the current path of the D-type transistor Dtr1 is connected to one end of the current path of the N-type transistor Ntr1, and the gate of the D-type transistor Dtr1 is connected to the output of the SW circuit. The D-type transistor Dtr1 is a transistor which has a negative threshold voltage and is constantly in an ON state. Thus, the voltage at a node N0, to which a high voltage is applied from the high voltage generating circuit 19-1, can effectively be relaxed.

The one end of the current path of the N-type transistor Ntr1 is connected to the other end of the current path of the D-type transistor Dtr1, the gate of the N-type transistor Ntr1 is connected to the output of the SW circuit, and the output of the N-type transistor Ntr1 is connected to the input of the global switch circuit GSW.

1-5-2. Resistance Varying Operation of the Resistance Variable Circuit

Next, referring to an operation table of FIG. 6, the operation of the resistance variable circuit 19-3 is described.

For example, in a data write operation and a data read operation, in the case where only one plane is selected (1 plane), all switching elements SW1 to SW4 are turned off. Thus, only the resistor element R1 is inserted in the pump module wiring PumpL between the high voltage generating circuit and the global control gate line GCGL.

Next, in the data write operation and data read operation, in the case where two planes are selected (2 plane), only the switching element SW2 is turned on (ON). Thus, a composite resistance, which is inserted in the pump module wiring PumpL, is a parallel-connected resistance of the resistor element R1 and resistor element R2 $(1/(1/R1+1/R2))$, and is lower than the composite resistance R1 at the time of 1-plane section.

In the data write operation and data read operation, in the case where three planes are selected (3 plane), the switching elements SW2 and SW3 are turned on (ON). Thus, the composite resistance, which is inserted in the pump module wiring PumpL, is $(1/(1/R1+1/R2+1/R3))$, and is still lower than the composite resistance at the time of 2-plane section.

In the data write operation and data read operation, in the case where the four planes are selected (4 plane), the switching elements SW2 to SW4 are turned on (ON). Thus, the composite resistance, which is inserted in the pump module wiring PumpL, is $(1/(1/R1+1/R2+1/R3+1/R4))$.

As has been described above, in the data write operation and data read operation, as the number of selected planes becomes larger, in other words, as the load capacitance becomes larger, the wiring resistance of the pump section wiring PumpL is made lower. Accordingly, when the load capacitance of the wiring is small, the wiring resistance is increased, thereby being able to suppress the word line rising speed and ripple. When the load capacitance is large, the wiring resistance is decreased, thereby being able to suppress the delay of the word line rising speed. As a result, the variance in characteristics due to the number of selected planes can be adjusted simply by varying the resistance of the resistance variable circuit 19-3, without altering the capability of the high voltage generating circuit 19-1. Therefore, there is also such a merit that the load on designing can be reduced.

Besides, in a so-called write-back operation after a data erase operation, that is, in the case where a write voltage is applied to plural word lines in a selected block after a data erase operation (BLOCK), at least the switching element SW1 is turned on (ON), thus making a transition to a state (bypass state) in which there is substantially no composite resistance.

1-5-3. Re: Composite Resistance

Next, referring to FIG. 7, a description is given of the result of provisional calculation of the composite resistance of the resistance variable circuit 19-3. In this embodiment, the provisional calculation was made on the assumption that the resistance of the resistor element R1 is about 30 kΩ, and the resistance of each of the resistor elements R2 to R4 is about 50 kΩ.

As shown in FIG. 7, in the case where one plane is selected (1 plane), the composite resistance R is about 30 kΩ, and the ratio (ratio) to the load capacitance, which will be described later, is about 1.0.

In the case where two planes are selected (2 plane), the composite resistance R is about 18.8 kΩ, and the ratio (ratio) to the load capacitance, which will be described later, is about $1/1.6$.

In the case where three planes are selected (3 plane), the composite resistance R is about 13.6 kΩ, and the ratio (ratio) to the load capacitance, which will be described later, is about $1/2.2$.

In the case where the four planes are selected (4 plane), the composite resistance R is about 10.7 kΩ, and the ratio (ratio) to the load capacitance, which will be described later, is about $1/2.8$.

As described above, the resistance value at the time of selection of plural planes (n planes) is a value greater than 1/n, relative to the resistance value at the time of selection of one plane. The reason for this is that the wiring capacitance of the common part is present. Thus, in other words, the resistor of the resistance variable circuit 19-3 varies the wiring resistance such that the resistance value at the time of selection of plural planes (n planes) becomes a value greater than 1/n.

In the data erase operation, in the case where a block that is an erase unit is selected (BLOCK), all switching elements SW1 to SW4 are turned on (ON), thus making a transition to the state (bypass state) in which there is substantially no composite resistance. Thus, the composite resistance R becomes substantially the same as the wiring (pump section wiring PumpL).

1-6. Structure Example of Wiring

Figure 8:
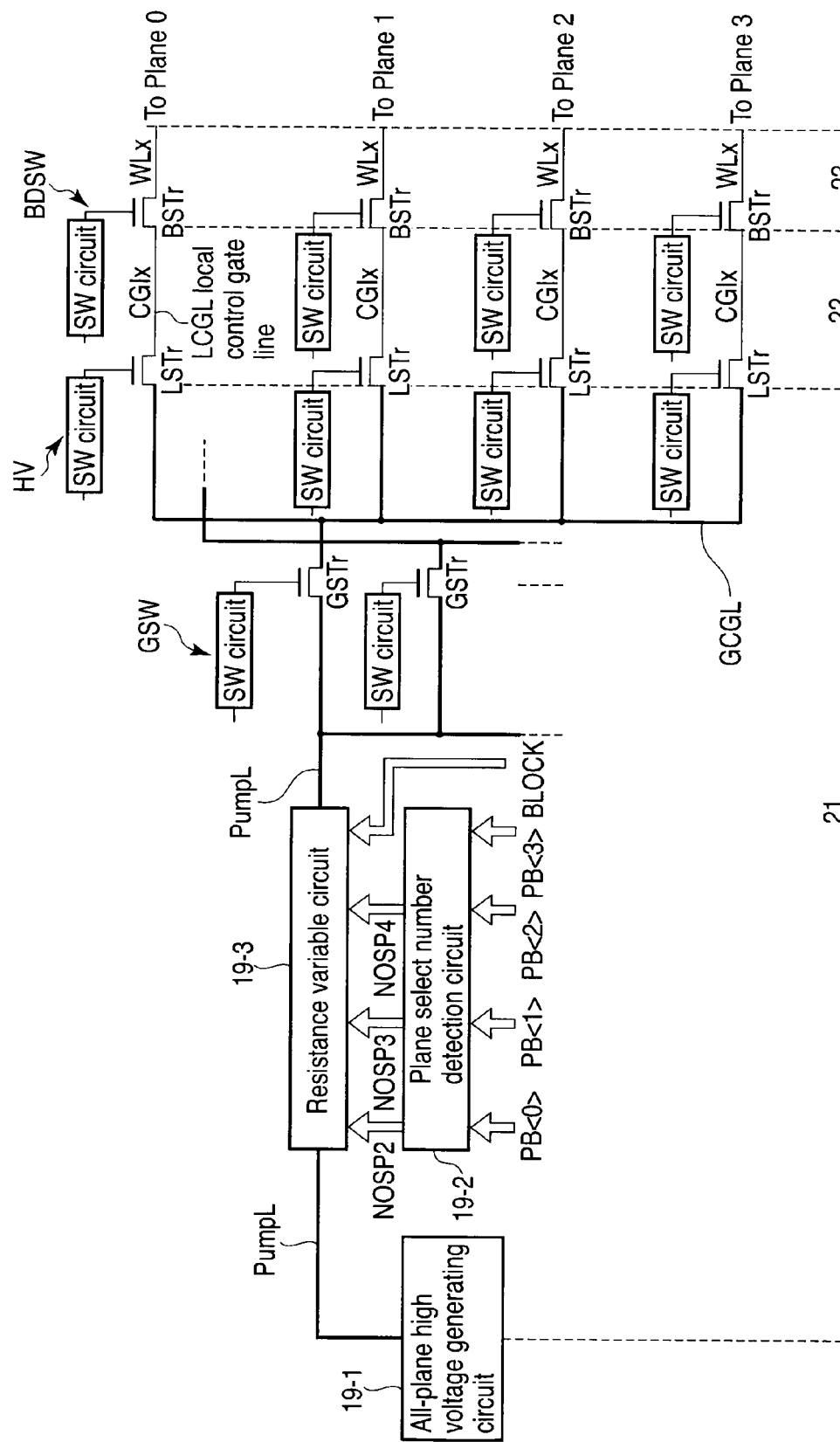
FIG. 8 is a block diagram showing a wiring structure example of the semiconductor integrated circuit device according to the first embodiment.

Next, referring to FIG. 8, a description is given of a structure example of wiring which is charged by the power supply generating circuit 19 according to the present embodiment.

As shown in FIG. 8, the structure of wiring, which is charged by the power supply generating circuit 19 according to the present embodiment, is a common wiring section 21, a local wiring section 22 and a word line section 23.

The common wiring section 21, as indicated by a heavy line in FIG. 8, comprises the pump section wiring PumpL and global control gate line GCGL. The pump section wiring PumpL electrically connects the all-plane high voltage generating circuit 19-1 and the global switch circuit GSW via the resistance variable circuit 19-3.

The global switch circuit GSW comprises a plurality of switching circuits SW and a plurality of switching transistors GSTr. One end of the current path of the switching transistor GSTr is connected to the pump section wiring PumpL and the other end of the current path is connected to the global control gate line GCGL, and the ON/OFF of the current path is switched by an output signal from the switching circuit SW, which is input to the gate of the switching transistor GSTr. The global control gate line GCGL electrically connects the global switch circuit GSW and the local switch circuit HV.

The local wiring section 22, as indicated by a thin line in FIG. 8, electrically connects the local switch circuit HV and a block decoder switch circuit BDSW. In addition, the local switch circuit HV comprises a plurality of switching circuits SW and a plurality of switching transistors LSTr. One end of the current path of the switching transistor LSTr is connected to the global control gate line GCGL and the other end of the current path is connected to the block decoder switch circuit BDSW, and the ON/OFF of the current path is switched by an output signal from the switching circuit SW, which is input to the gate of the switching transistor LSTr.

The word line section 23, as indicated by a thin line in FIG. 8, electrically connects the block decoder switch circuit BDSW and the planes (Plane0 to Plane3). The block decoder switch circuit BDSW is disposed in the block decoder (BD0 to BD3), and comprises a plurality of switching circuits SW and a plurality of switching transistors BSTr. One end of the current path of the switching transistor BSTr is connected to the local control gate line LCGL and the other end of the current path is connected to the word line WLx, and the ON/OFF of the current path is switched by an output signal from the switching circuit SW, which is input to the gate of the switching transistor BSTr.

1-7. Total of Wiring Load Capacitance

Next, referring to FIG. 9, a description is given of the total of the wiring load capacitances which are charged by the power supply voltage generating circuit 19 according to the present embodiment. As has been described above, the NAND flash memory according to this embodiment includes the memory cell array 11 which is divided into the four planes (PL0 to PL3).

As shown in FIG. 9, the total of the wiring load capacitances, which are charged by the power supply voltage generating circuit 19, is the total of a load capacitance C1 of the common section and a load capacitance, (C2+C3)×4, of the part depending on the number of select planes. Specifically, there is the following correspondency in the wiring structure in FIG. 8:

Common part C1: the load capacitance of common wiring part 21 ("heavy line" in FIG. 8), and Part (C2+C3) depending on the number of select planes: the load capacitance of the local wiring section 22 and word line section 23 ("thin line" in FIG. 8).

It is thus understood that the wiring load capacitance, which is charged by the power supply voltage generating circuit 19, comprises the load capacitance C1 which commonly appears if the global switch circuit GSW is turned on, without depending on the number of selected planes, and the part (C2+C3) depending on the number of selected planes corresponding to the plural planes (PL0 to PL3).

1-8. Relationship Between the Number of Selected Planes and the Load Capacitance Next, referring to FIG. 10, a description is given of the relationship between the number of selected planes and the load capacitance in the present embodiment.

As shown in the middle part of FIG. 10 (capacitance per 1 WL/Plane), in the semiconductor integrated circuit device having plural planes of two or more planes, the load capacitance, which is to be charged, varies when one plane is selected and when two or more plural planes are selected at the same time. In this example, in consideration of the wiring length and the number of transistors, the capacitance of each wiring was provisionally calculated on the assumption that the capacitance of the word line is about 2 pF, the capacitance of the local control gate line is about 6 pF, and the capacitance of the pump section wiring PumpL and global control gate line GCGL is about 5 pF.

As a result, in the 4-plane configuration in the present embodiment, the capacitance varies in the following manner.

Case of 1 Plane selection: 5+(2+6)×1=about 13 pF
Case of 2 Plane selection: 5+(2+6)×2=about 21 pF
Case of 3 Plane selection: 5+(2+6)×3=about 29 pF
Case of 4 Plane selection: 5+(2+6)×4=about 37 pF.

As described above, if the load capacitance varies depending on the number of selected planes, the charging time greatly varies accordingly, leading to degradation in operation margin. Thus, there is an idea that the capability of the power supply voltage generating circuit should be varied depending on the number of selected planes.

However, it is not easy to execute such control as to exactly vary the supply capability of the power supply voltage generating circuit in accordance with the load capacitance which varies depending on the number of selected planes.

The reason for this is that, as indicated in the provisional calculation in the present example as shown in FIG. 10, in the case of the semiconductor integrated circuit device of the 4-plane configuration, the load capacitances in the 1-plane operation, 2-plane operation time and 4-plane operation do not simply increase in such a manner that the load capacitance increases two times or four times, compared to the load capacitance at the time of the 1-plane operation.

As shown in FIG. 10, it is clear that the load capacitance in the 2-plane operation is not double the load capacitance in the 1-plane operation. In the provisional calculation, even if the number of selected planes increases two times and four times, the load capacitance increases about 1.6 times and about 2.8 times.

The reason for this is that the load capacitance C1 of the common part is present, regardless of the number of selected planes. In the present example, the load capacitance C1 of the common part corresponds to the capacitance of about 5 pF of the pump section wiring PumpL and the global control wiring.

As a countermeasure, it may be thought to adopt such a structure that a voltage generator is provided for each of the planes, and the voltage generator is operated only when the associated plane is selected. However, in this structure, at the times of the 2-plane operation and 4-plane operation, the capabilities of the associated voltage generators become two times greater and four times greater, which do not correspond to the actual variations in load capacitance. Furthermore, compared to the actual variations in load capacitance, excessive capabilities are provided when plural planes are selected. Besides, in this structure, a decrease in operation margin is caused by the non-uniformity in word line rising speed due to the number of selected planes, and voltage generators having excessive capabilities, compared to the load, are needed, resulting in a possible increase in layout area and a possible increase in power consumption.

Taking the above into account, in the present embodiment, the resistance of the wiring (pump section wiring PumpL) between the plural planes PL0 to PL3 and the all-plane high voltage generating circuit 19-1 is varied in accordance with the number of selected planes (select signals NOSP2 to NOSP4) which is reported from the plane select number detection circuit 19-2, without varying the voltage supply capability of the all-plane high voltage generating circuit 19-1 which is configured to generate a power supply voltage common to the plural planes PL0 to PL3. Thereby, even in the case where the load capacitance varies in accordance with the variation in the number of selected planes, the wiring resistance can be varied in accordance with the number of selected planes. It is thus possible to prevent the charging time from varying due to the number of selected planes. Therefore, the operation margin can be improved.

For example, in the data write operation and data read operation, in the case where only one plane is selected (1 plane), the resistor element R1 can be inserted in the pump section wiring PumpL as the composite resistance.

For example, in the case where two planes are selected (2 plane), the composite resistance, which is inserted in the pump section wiring PumpL, can be set to be the parallel-connected resistance of the resistor element R1 and resistor element R2 (1/(1/R1+1/R2)), and can be made lower than the composite resistance R1 at the time of 1-plane section.

For example, in the data write operation and data read operation, in the case where three planes are selected (3 plane), the composite resistance of wiring, which is inserted in the pump section wiring PumpL, can be set at (1/(1/R1+1/R2+1/R3)), and can be made still lower than the composite resistance at the time of 2-plane section.

Further, in the data write operation and data read operation, in the case where the four planes are selected (4 plane), the composite resistance of wiring, which is inserted in the pump section wiring PumpL, can be set at (1/(1/R1+1/R2+1/R3+1/R4)) and can be reduced to the minimum.

As has been described above, in the data write operation and data read operation, as the number of selected planes becomes larger, in other words, as the load capacitance becomes larger, the wiring resistance of the pump section wiring PumpL is made lower. Accordingly, when the load capacitance of the wiring is small, the wiring resistance is increased, thereby being able to suppress the word line rising speed and ripple. When the load capacitance is large, the wiring resistance is decreased, thereby being able to suppress the delay of the word line rising speed. As a result, the variance in characteristics due to the number of selected planes can be adjusted simply by varying the resistance of the resistance variable circuit 19-3, without altering the capability of the high voltage generating circuit 19-1.

<2. Rising Voltage Characteristics>

Figure 11:
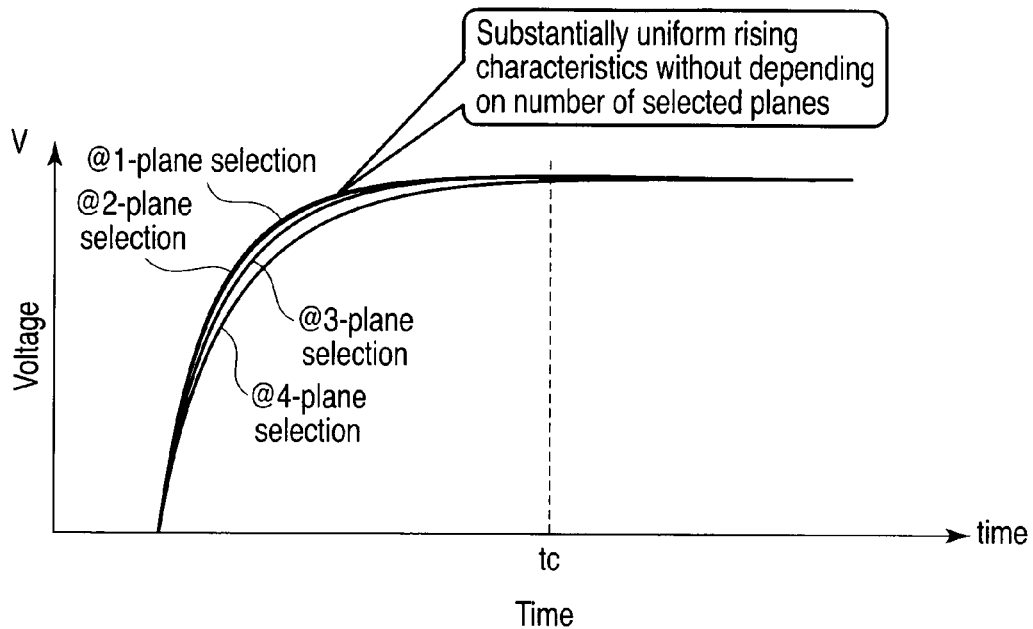
FIG. 11 is a graph showing rising characteristics of the semiconductor integrated circuit device according to the first embodiment.
Figure 12:
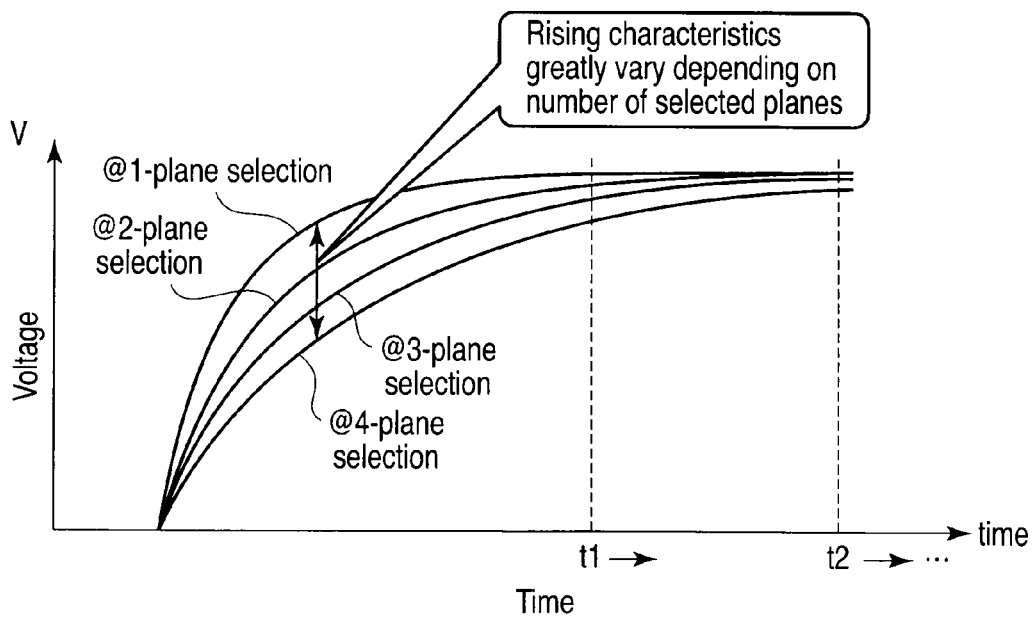
FIG. 12 is a graph showing rising characteristics of a semiconductor integrated circuit device according to a comparative example.

Next, referring to FIG. 11 and FIG. 12, a description is given of the rising voltage characteristics of the semiconductor integrated circuit device.

2-1. Rising Speed in the First Embodiment

To begin with, referring to FIG. 11, a description is given of the rising voltage characteristics of the semiconductor integrated circuit device according to the first embodiment.

As shown in FIG. 11, as regards the relationship between time (time) and a voltage (V), substantially uniform rising characteristics are realized in each of the cases of 1-plane section, 2-plane section, 3-plane section and 4-plane selection. For example, in the present embodiment, regardless of the selection of one to four planes, the load capacitance can be charged at a substantially fixed time tc.

It is thus understood that according to the structure of the present embodiment, substantially uniform rising characteristics can be obtained, without depending on the number of selected planes.

2-2. Rising Speed in Comparative Example

Next, referring to FIG. 12, a description is given of the rising voltage characteristics of a semiconductor integrated circuit device according to a comparative example which will be described later.

As shown in FIG. 12, as regards the relationship between time (time) and a voltage (V), rising characteristics greatly vary between the cases of 1-plane section, 2-plane section, 3-plane section and 4-plane selection. In the case of the comparative example, the charging time of the load capacitance gradually increases (time t1→time t2, . . . ) as the number of selected planes becomes larger in the order of one plane, two planes, three planes and four planes.

It is thus understood that according to the structure of the comparative example, the rising characteristics greatly vary depending on the number of selected planes.

<3. Advantageous Effects>

According to the semiconductor integrated circuit device of the first embodiment, at least the following advantageous effects (1) and (2) can be obtained.

(1) The operation margin can be improved.

As has been described above, the semiconductor integrated circuit device according to the first embodiment comprises, at least, a memory cell array 11 including a plurality of planes PL0 to PL3 each including a plurality of memory cells MT; a power supply voltage generating circuit 19 including a voltage generating circuit 19-1 configured to generate a power supply voltage common to the plurality of planes, a select number detection circuit 19-2 configured to detect the number of selected planes of the plurality of planes, and a resistance variable circuit 19-3 configured to vary the wiring resistance between the plurality of planes and the power supply voltage generating circuit for planes in accordance with the number of selected planes (NOSP2 to NOSP4) which is reported from the select number detection circuit; and a control circuit 17 configured to control the power supply voltage generating circuit 19.

In other words, in the semiconductor integrated circuit apparatus according to the first embodiment, the resistance of the wiring (pump section wiring PumpL) between the plural planes PL0 to PL3 and the all-plane high voltage generating circuit 19-1 is varied in accordance with the number of selected planes (select signals NOSP2 to NOSP4) which is reported from the plane select number detection circuit 19-2, without varying the voltage supply capability of the all-plane high voltage generating circuit 19-1 which is configured to generate a power supply voltage common to the plural planes PL0 to PL3.

Thereby, even in the case where the load capacitance varies in accordance with the number of selected planes, the wiring resistance can be varied in accordance with the number of selected planes. It is thus possible to prevent the charging time from varying due to the number of selected planes. Therefore, the operation margin can be improved.

For example, in the data write operation and data read operation, in the case where only one plane is selected (1 plane), the resistor element R1 can be inserted in the pump section wiring PumpL as the composite resistance.

For example, in the case where two planes are selected (2 plane), the composite resistance, which is inserted in the pump section wiring PumpL, can be set to be the parallel-connected resistance of the resistor element R1 and resistor element R2 (1/(1/R1+1/R2)), and can be made lower than the composite resistance R1 at the time of 1-plane section.

For example, in the data write operation and data read operation, in the case where three planes are selected (3 plane), the composite resistance of wiring, which is inserted in the pump section wiring PumpL, can be set at (1/(1/R1+1/R2+1/R3)), and can be made still lower than the composite resistance at the time of 2-plane section.

Further, in the data write operation and data read operation, in the case where the four planes are selected (4 plane), the composite resistance of wiring, which is inserted in the pump section wiring PumpL, can be set at (1/(1/R1+1/R2+1/R3+1/R4)) and can be reduced to the minimum.

As has been described above, in the data write operation and data read operation, the resistance variable circuit 19-3 varies the wiring resistance (load capacitance) in inverse proportion to the number of selected planes. Specifically, as the number of selected planes becomes larger, in other words, as the load capacitance becomes larger, the wiring resistance of the pump section wiring PumpL is made lower. Accordingly, when the load capacitance of the wiring is small, the wiring resistance is increased, thereby being able to suppress the word line rising speed and ripple. When the load capacitance is large, the wiring resistance is decreased, thereby being able to suppress the delay of the word line rising speed. As a result, the variance in characteristics due to the number of selected planes can be adjusted simply by varying the resistance of the resistance variable circuit 19-3, without altering the capability of the high voltage generating circuit 19-1.

As has been described above, according to the structure and operation of the present embodiment, even if there is a load variation due to the change of the number of selected planes with the promotion of the multi-plane configuration, optimal control can easily be executed at all times. Thus, even in the case where the capacitance load varies due to the change of the number of selected planes, it is possible to prevent the charging time from varying due to the number of selected planes. Therefore, the operation margin can be improved.

This is clear from the rising voltage characteristics of the semiconductor integrated circuit device, as shown in FIG. 11, which are based on the knowledge acquired by the inventor of the present invention.

(2) The capacity can advantageously be increased.

In order to realize the increase in capacity, it is thought to be a prospective solution to construct a memory cell array in a multi-plane configuration, while promoting microfabrication of memory cells.

In the present embodiment, as described above in connection with the advantageous effect (1), the multi-plane configuration can be adopted without degrading the operation margin. Thus, the capacity can advantageously be increased. In addition, it is expected that the structure of the present embodiment is prospective, for example, for generations of less than 30 nm, for example, the 20 nm generation 20, 10 nm generation, etc., in which memory cells are further shrunk.

Second Embodiment

Other Structure Example

Next, a semiconductor integrated circuit device according to a second embodiment of the invention is described with reference to FIG. 13. This embodiment relates to another structure example. In the description below, a detailed description of the parts common to those of the first embodiment is omitted.

<Structure Example>

Figure 13:
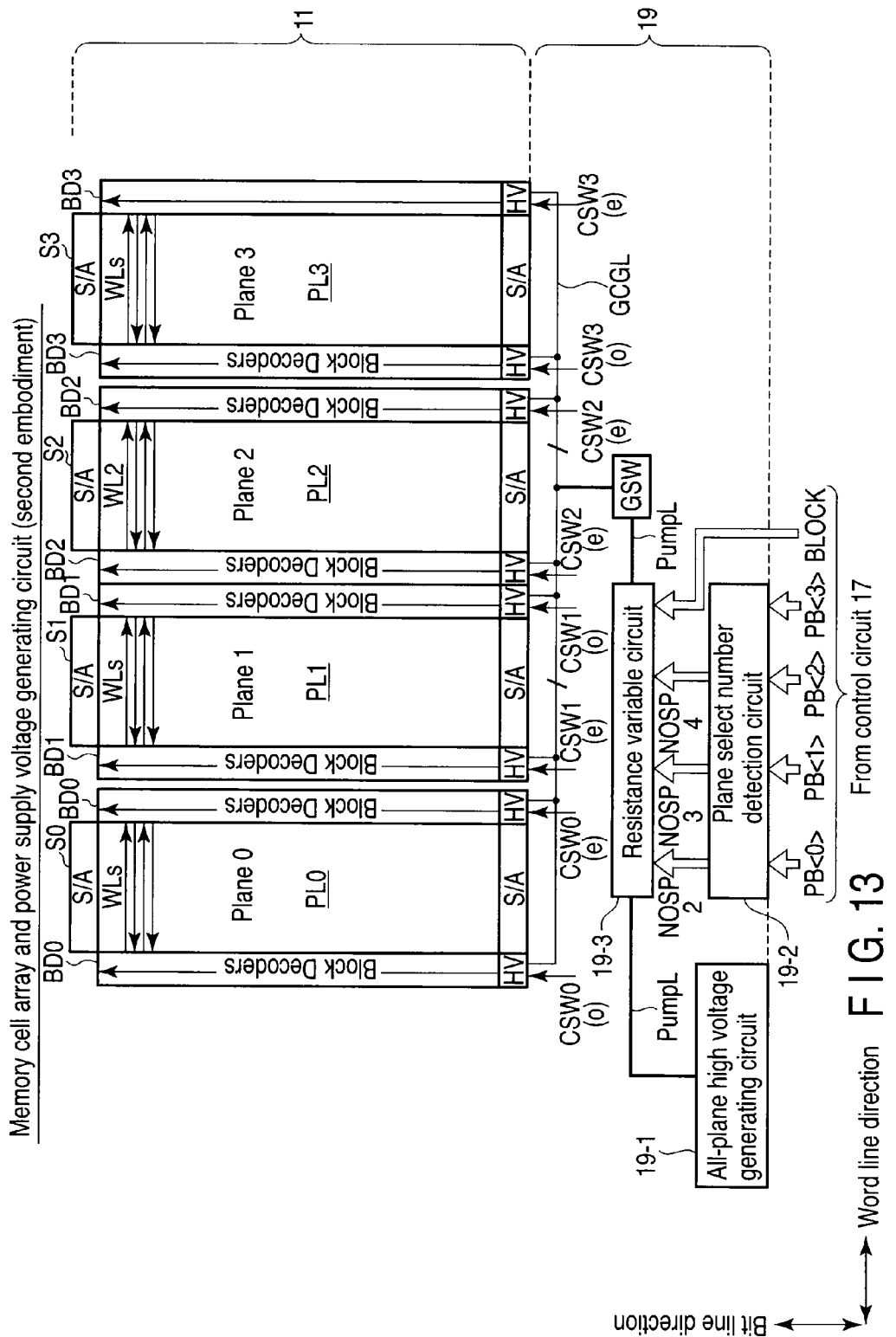
FIG. 13 is a block diagram showing a memory cell array and a power supply voltage generating circuit according to a second embodiment of the invention.

As shown in FIG. 13, the semiconductor integrated circuit device according to the second embodiment differs from the first embodiment in that as regards the memory cell array 11, block decoders BD, local switch circuits HV and sense amplifiers S/A are additionally disposed at both ends of the planes PL0 to PL3.

Thus, even if the microfabrication of memory cells is advanced, the margin of lithography of the block decoders BD0 to BD3 can be increased, and therefore microfabrication can advantageously be achieved. To be more specific, in the case where one plane comprises, for example, about 2000 blocks, it is necessary to dispose 2000 block decoders BD0 to BD3, the number of which is the same as the number of blocks. If block decoders are disposed only on one side of the plane, it is necessary to dispose 2000 block decoders on one side with the same pitch as the blocks. On the other hand, as in the present embodiment, in the structure in which the block decoders BD0 to BD3 are disposed on both sides of the planes PL0 to PL3, it should suffice if 1000 block decoders are disposed on each of both sides of the plane. Accordingly, since the block decoders BD0 to BD3 can be disposed with the double the pitch of blocks, the margin of the lithography can be improved.

<Advantageous Effects>

According to the semiconductor integrated circuit device of the second embodiment, at least the same advantageous effects (1) and (2) as described above can be obtained. Furthermore, the following advantageous effect (3) can be obtained.

(3) Microfabrication can advantageously be achieved.

In the semiconductor integrated circuit device according to the second embodiment, as regards the memory cell array 11, block decoders BD, local switch circuits HV and sense amplifiers S/A are additionally disposed at both ends of the planes PL0 to PL3.

Thus, even if the microfabrication of memory cells is advanced, the margin of lithography of the block decoders BD0 to BD3 can be increased, and therefore microfabrication can advantageously be achieved. To be more specific, in the case where one plane comprises, for example, about 2000 blocks, it is necessary to dispose 2000 block decoders BD0 to BD3, the number of which is the same as the number of blocks. If block decoders are disposed only on one side of the plane, it is necessary to dispose 2000 block decoders on one side with the same pitch as the blocks. On the other hand, as in the present embodiment, in the structure in which the block decoders BD0 to BD3 are disposed on both sides of the planes PL0 to PL3, it should suffice if 1000 block decoders are disposed on each of both sides of the plane. Accordingly, since the block decoders BD0 to BD3 can be disposed with the double the pitch of blocks, the margin of the lithography can be improved.

Comparative Example

Example of Batchwise Control of Planes

Figure 14:
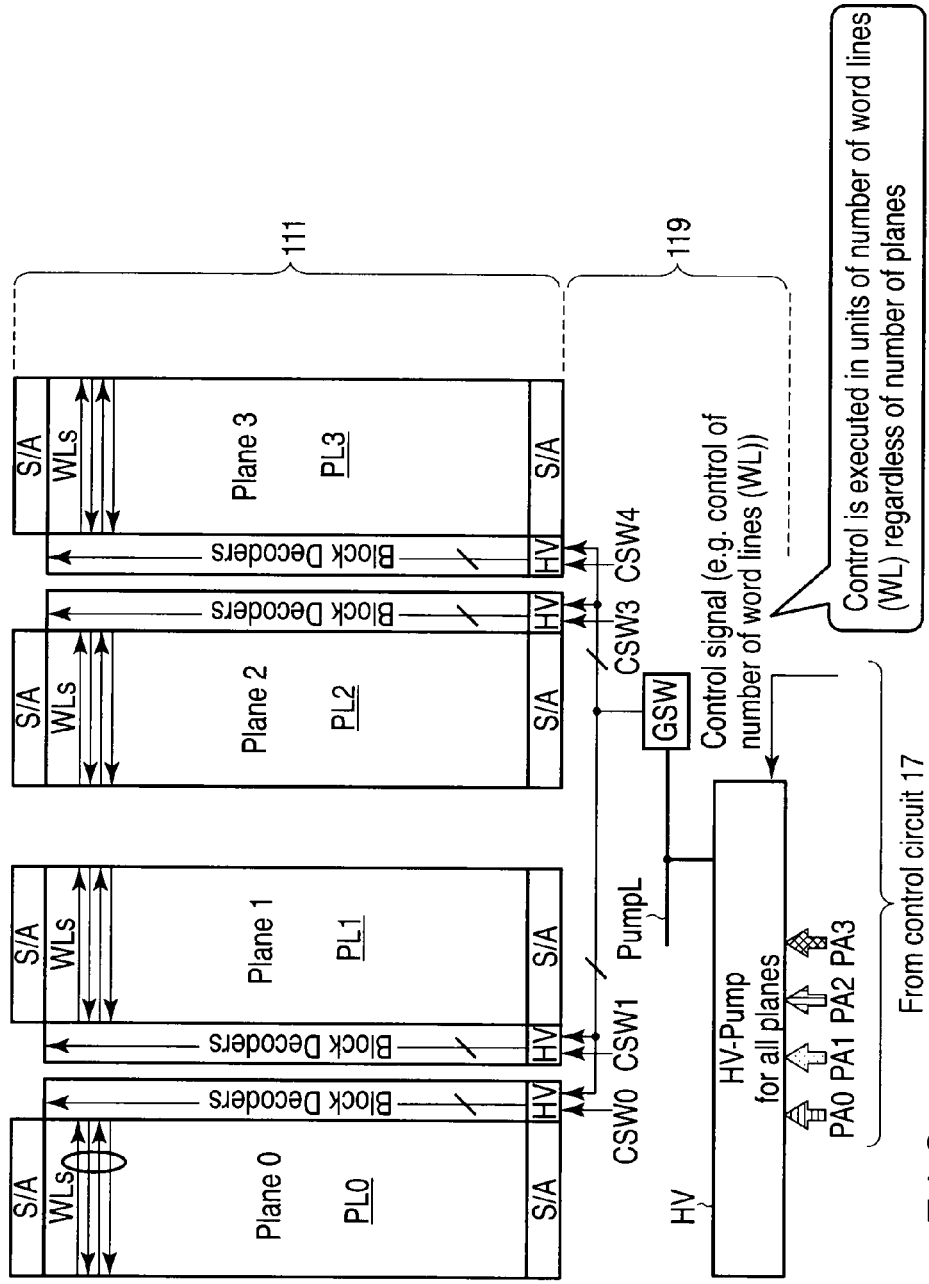
FIG. 14 is a block diagram showing a memory cell array and a power supply voltage generating circuit according to a comparative example.

Next, referring to FIG. 14, a description is given of a semiconductor integrated circuit device according to a comparative example, for the purpose of comparison with the semiconductor integrated circuit devices according to the first and second embodiments. This comparative example relates to an example of batch-control of power supply voltages of planes. In the description below, a detailed description of the parts common to those of the first embodiment is omitted. The structure of the present comparative example does not show an objective prior-art structure at the time of filing of the present application, but is an example for comparison with the semiconductor integrated circuit devices according to the first and second embodiments.

As shown in FIG. 14, the comparative example is common to the first and second embodiments in that a memory cell array 111 of the comparative example includes a plurality of planes (PL0 to PL3).

On the other hand, the comparative example differs from the first and second embodiments in that a power supply voltage generating circuit 119 of the comparative example includes only a single voltage generating circuit HV (HV-Pump for all planes), and a power supply voltage is applied by only the voltage generating circuit HV regardless of the number of selected planes.

Thus, in the structure of the comparative example, for example, at the time of a data read operation and at the time of a data write operation, power supply voltages that are supplied are controlled by control signals which are input in association with the number of word lines (e.g. 4, 8, 16, ...), irrespective of the number of selected planes. In the case of a single-plane configuration, even with this structure and control, no degradation occurs in the operation margin due to the variation of the load capacitance.

However, in the semiconductor integrated circuit device having a plurality of planes of two or more planes, the load capacitance, which is to be charged, varies between when one plane is selected and when a plurality of planes of two or more planes are selected at the same time. The charging time greatly varies depending on the number of selected planes, leading to degradation in operation margin. Thus, there is an idea that the capability of the power supply voltage generating circuit should be varied depending on the number of selected planes, but it is not easy to execute such control as to exactly vary the supply capability of the power supply voltage generating circuit in accordance with the load capacitance which varies depending on the number of selected planes.

As indicated by the provisional calculation in FIG. 10, in the case of the semiconductor integrated circuit device of the 4-plane configuration, the load capacitances in the 1-plane operation, 2-plane operation time and 4-plane operation do not simply increase in such a manner that the load capacitance increases two times or four times, compared to the load capacitance at the time of the 1-plane operation.

Consequently, in the structure of the comparative example, as shown in FIG. 12, the rising voltage characteristics vary such that the charging time of the load capacitance gradually increases (time t1→time t2, ...) as the number of selected planes becomes larger in the order of one plane, two planes, three planes and four planes.

In the structure and operation of the comparative example, if the multi-plane configuration of two or more planes is promoted, the load capacitance varies in accordance with the variation of the number of selected planes, and consequently the charging time greatly varies depending on the number of selected planes. Thus, the operation margin decreases disadvantageously. Moreover, the structure and operation of the comparative example are disadvantageous for an increase in capacity.

The present invention is not limited to the structures and operations shown in the above-described embodiments and comparative example. For example, in the structure shown in FIG. 3, in the case of a 2-plane configuration comprising only planes PL0 and PL1, without planes PL2 and PL3, the select number detection circuit 19-2 may be dispensed with, and such a structure may be adopted that control signals PB<0> and PB<1> are directly input from the control circuit 17 to the resistance variable circuit 19-3.

In this case, only local control signals CSW0 and CSW1, which are input from the control circuit 17 via the global switch circuit GSW, are used and are input to the block (BLOCK) as shown in the Figures. In addition, for example, in the structure in which the control signals PB<0> and PB<1> are directly received in the resistance variable circuit 19-3, such resistance control may be executed that 2-plane selection is determined if the logical product "AND" of the control signals PB<0> and PB<1> is calculated and the calculation result is "H" state, and 1-plane selection is determined if the "XOR" is calculated and the calculation result is "H" state.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a memory cell array including a plurality of planes each including a plurality of memory cells;
a power supply voltage generating circuit including a voltage generating circuit configured to generate a power supply voltage common to the plurality of planes, a select number detection circuit configured to detect a number of selected planes of the plurality of planes, and a resistance variable circuit configured to vary a load resistance between the plurality of planes and the voltage generating circuit in accordance with the number of selected planes, which is reported from the select number detection circuit; and
a control circuit configured to control the power supply voltage generating circuit.

2. The device of claim 1, wherein the resistance variable circuit is configured to decrease the load resistance in accordance with an increase in the number of selected planes which is reported from the select number detection circuit.

3. The device of claim 1, wherein the resistance variable circuit is inserted in a wiring which electrically connects word lines, which are selected, and the voltage generating circuit, and
the resistance variable circuit is configured to vary, at a time of a data write operation of the memory cells, the load resistance in inverse proportion to the number of selected planes which is reported from the select number detection circuit, thus making a transition to a bypass state in which the load resistance is absent at a time of applying a write voltage to a plurality of word lines of the memory cells.

4. The device of claim 1, wherein the select number detection circuit comprises:
a half adder module configured to half-add control signals which are input from the control circuit; and
a compound module configured to compound signals from the half adder module and to generate a plane select signal.

5. The device of claim 4, wherein the half adder module comprises first to fourth half adder circuits,
the first half adder circuit has inputs to which the control signals are input, has a first output connected to a first input of the third half adder circuit, and has a second output connected to a first input of the fourth half adder circuit, the second half adder circuit has inputs to which the control signals are input, has a first output connected to a second input of the third half adder circuit, and has a second output connected to a second input of the fourth half adder circuit, the third half adder circuit has a first output and a second output, which are connected to inputs of the compound module, and the fourth half adder circuit has a first output and a second output, which are connected to inputs of the compound module.

6. The device of claim 5, wherein the compound module comprises a first AND circuit, a second AND circuit, a first OR circuit and a second OR circuit, the first AND circuit has inputs connected to the outputs of the third and fourth half adder circuits, and has an output connected to an input of the first OR circuit, the second AND circuit has inputs connected to the output of the third half adder circuit and to an inverted output of the fourth half adder circuit, and has an output connected to an input of the second OR circuit, the first OR circuit has inputs connected to the output of the first AND circuit and the output of the third half adder circuit; and the second OR circuit has inputs connected to the output of the second AND circuit, to the output of the fourth half adder circuit, and to an output of the first OR circuit.

7. The device of claim 1, wherein the resistance variable circuit comprises:

a composite resistance module configured to vary a composite resistance thereof in accordance with the number of selected planes; and a switch module configured to switch and connect an output of the composite resistance module to the memory cell array.

8. The device of claim 7, wherein the composite resistance module comprises a switching circuit, first to fourth resistor elements, and first to fourth switching elements.

9. The device of claim 8, wherein the switching circuit has an input connected to a high voltage power supply which is input from the voltage generating circuit, and outputs signals to gates of the first to fourth switching elements in accordance with a plane control signal from the select number detection circuit or a block select signal from the control circuit.

10. The device of claim 8, wherein the first resistor element has one end connected to a program voltage, and has the other end connected to one end of a current path of the first switching element, and each of the second to fourth resistor elements has one end connected to the program voltage, and the other end connected to one end of each of current paths of the second to fourth switching elements.

11. The device of claim 8, wherein one end of a current path of the first switching element is connected to a program voltage, and the other end of the current path of the first switching element is connected to an input of the switch module, and the a gate of the first switching element is connected to an output of the switching circuit, and one end of each of current paths of the second to fourth switching elements is connected to the input of the switch module, and the gate of each of the second to fourth switching elements is connected to the output of the switching circuit.

12. The device of claim 7, wherein the switch module comprises a switching circuit, a D-type transistor and an N-type transistor.

13. The device of claim 12, wherein the switching circuit has an input connected to a high voltage power supply which is input from the voltage generating circuit, and outputs signals to gates of the D-type transistor and the N-type transistor in accordance with a plane control signal from the select number detection circuit or a block select signal from the control circuit, one end of a current path of the D-type transistor is connected to an output of the composite resistance module, and one end of a current path of the N-type transistor is connected to the other end of the current path of the D-type transistor.

14. The device of claim 1, further comprising a global switch circuit configured to switch and supply the power supply voltage, which is supplied from the voltage generating circuit and varied by the resistance variable circuit, to the plane which is selected.

15. The device of claim 1, wherein the plane comprises:

a plurality of blocks each comprising the plurality of memory cells disposed at intersections between a plurality of word lines and a plurality of bit lines;

a block decoder configured to select any one of the plurality of blocks in accordance with a block select signal from the control circuit; and a local switch circuit configured to switch ON/OFF of the block decoder in accordance with a local control signal which is input from the control circuit.

16. The device of claim 1, wherein the memory cell has a multilayer structure comprising a gate insulation film, a charge accumulation layer, an inter-gate insulation film and a control electrode layer, which are successively stacked on a semiconductor substrate.

17. The device of claim 1, wherein the load resistance between the plurality of planes and the power supply voltage generating circuit is connected in series to the power supply voltage generating circuit and the planes.

18. The device of claim 17, wherein the resistance variable circuit includes a switching circuit, a first resistance variable unit, and a second resistance variable unit connected in parallel;

the load resistance includes a first switch element and a second switch element, the first resistance variable unit includes a first resistance unit, and the first switch element which varies a value of the load resistance;

the second resistance variable unit includes a second resistance unit, and the second switch element which varies a value of the load resistance;

one end of the current path and the other end of the current path of the first resistance unit are connected to one end and the other end of the first switch element, respectively;

one end of the current path of the second resistance unit is connected to the one end of the second switch element; and the switching circuit outputs signals to gates of the first and second switching elements in accordance with a plane control signal from the select number detection circuit or a block select signal from the control circuit.

19. A semiconductor integrated circuit device comprising:

a memory cell array including two planes each including a plurality of memory cells;

a power supply voltage generating circuit including a voltage generating circuit configured to generate a power supply voltage common to the two planes, and a resistance variable circuit configured to vary a load resistance between the two planes and the voltage generating circuit in accordance with a number of selected planes of the two planes; and a control circuit configured to control the power supply voltage generating circuit.

20. The device of claim 19, wherein the load resistance between the plurality of planes and the power supply voltage generating circuit is connected in series to the power supply voltage generating circuit and the planes.

21. The device of claim 20, wherein the resistance variable circuit includes a switching circuit, a first resistance variable unit, and a second resistance variable unit connected in parallel;

the load resistance includes a first switch element and a second switch element, the first resistance variable unit includes a first resistance unit, and the first switch element which varies a value of the load resistance;

the second resistance variable unit includes a second resistance unit, and the second switch element which varies a value of the load resistance;

one end of the current path and the other end of the current path of the first resistance unit are connected to one end and the other end of the first switch element, respectively;

one end of the current path of the second resistance unit is connected to the one end of the second switch element; and the switching circuit outputs signals to gates of the first and second switching elements in accordance with a plane control signal from the select number detection circuit or a block select signal from the control circuit.

22. A semiconductor integrated circuit device comprising:

a memory cell array including two planes each including a plurality of memory cells;

a power supply voltage generating circuit including a voltage generating circuit configured to generate a power supply voltage common to the two planes, and a resistance variable circuit configured to vary a load resistance between the two planes and the voltage generating circuit; and a control circuit configured to control the power supply voltage generating circuit.

23. The device of claim 22, wherein the load resistance between the plurality of planes and the power supply voltage generating circuit is connected in series to the power supply voltage generating circuit and the planes.

24. The device of claim 23, wherein the resistance variable circuit includes a switching circuit, a first resistance variable unit, and a second resistance variable unit connected in parallel;

the load resistance includes a first switch element and a second switch element, the first resistance variable unit includes a first resistance unit, and the first switch element which varies a value of the load resistance;

the second resistance variable unit includes a second resistance unit, and the second switch element which varies a value of the load resistance;

one end of the current path and the other end of the current path of the first resistance unit are connected to one end and the other end of the first switch element, respectively;

one end of the current path of the second resistance unit is connected to the one end of the second switch element; and the switching circuit outputs signals to gates of the first and second switching elements in accordance with a plane control signal from the select number detection circuit or a block select signal from the control circuit.

* * * * *